(12) United States Patent
Miller et al.

(10) Patent No.: US 6,570,102 B2
(45) Date of Patent: May 27, 2003

(54) STRUCTURE FOR HIGH SPEED PRINTED WIRING BOARDS WITH MULTIPLE DIFFERENTIAL IMPEDANCE-CONTROLLED LAYER

(75) Inventors: Thomas Richard Miller, Endwell, NY (US); Konstantinos I. Papathomas, Endicott, NY (US); Brian Eugene Curcio, Binghamton, NY (US); Joseph J. Sniezek, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/878,533

(22) Filed: Jun. 11, 2001

(65) Prior Publication Data

US 2002/0007966 A1 Jan. 24, 2002

Related U.S. Application Data

(63) Continuation-in-part of application No. 09/495,628, filed on Feb. 1, 2000, now Pat. No. 6,469,256.

(51) Int. Cl.[7] .......................... H01R 12/04; H05K 1/11
(52) U.S. Cl. .......................... 174/261; 174/262; 29/832
(58) Field of Search ........................... 174/261–266; 29/832

(56) References Cited

U.S. PATENT DOCUMENTS

| 3,673,680 A |   | 7/1972 | Tanaka et al. |
| 4,610,756 A |   | 9/1986 | Strobel |
| 4,661,654 A |   | 4/1987 | Strobel |
| 4,663,497 A | * | 5/1987 | Reimann ..................... 174/264 |
| 5,281,771 A |   | 1/1994 | Swift et al. |
| 5,336,855 A |   | 8/1994 | Kahlert et al. |
| 5,638,598 A | * | 6/1997 | Nakaso et al. .............. 174/262 |
| 5,744,758 A | * | 4/1998 | Takenouchi et al. ........ 174/255 |
| 5,822,856 A |   | 10/1998 | Bhatt et al. |
| 6,320,140 B1 | * | 11/2001 | Enomoto ..................... 174/255 |
| 6,323,439 B1 | * | 11/2001 | Kambe et al. .............. 174/255 |
| 6,351,393 B1 | * | 2/2002 | Kresge et al. .............. 174/252 |

* cited by examiner

Primary Examiner—Albert W. Paladini
Assistant Examiner—Jeremy Norris
(74) Attorney, Agent, or Firm—Scully, Scott, Murphy & Presser; Lawrence R. Fraley, Esq.

(57) ABSTRACT

A method and arrangement for creating an impedance controlled printing wiring board, particularly the formation of a structure for high speed printed wiring boards incorporating multiple differential impedance controlled layers. Furthermore, there are provided vias of either through-holes, blind holes and buried holes filled with a conductive paste material to form electrical interconnections with conductive layers of the printed wiring board.

20 Claims, 6 Drawing Sheets

STRUCTURE FOR HIGH SPEED PRINTED WIRING BOARDS WITH MULTIPLE DIFFERENTIAL IMPEDANCE-CONTROLLED LAYER

CROSS-REFERENCE TO RELATED PATENT APPLICATION

This application is a continuation-in-part patent application of Serial No.: 09/495,628 filed on Feb. 1, 2000 now U.S. Pat. No. 6,469,256.

BACKGROUND OF THE INVENTION

1. Field of the Invention

The present invention relates to a method for creating an impedance controlled printed wiring board. More particularly, the invention is directed to the formation of a structure for high speed printed wiring boards incorporating multiple differential impedance controlled layers. Furthermore, the invention is also directed to the provision of a method for producing an impedance controlled printed circuit wiring board. Moreover, the invention is further directed to the provision of a method for producing high speed printed wiring boards with multiple differential impedance controlled layers; especially with edge and broadside differentials.

In essence, problems are encountered in the technology with regard to the production of printed wiring boards and which incorporate so-called deep blind vias while maintaining a tight and stringent impedance control.

Presently, printed-wiring board (PWB) products which are intended for high frequency applications are provided with plated through holes (PTH's) extending through the thickness of the board thickness, and resultingly creating an antenna which can adversely affect signal integrity. Thus, by terminating the plated through holes at specific layers within the printed wiring board, the undesired antenna effect is substantially reduced or possibly even completely eliminated.

Basically, high frequency printed wiring boards necessitate an extremely tight control over impedance, such as along differential depths, board edges and alike, in order to maintain high levels of signal integrity. Consequently, in the construction of multi-layer printed wiring boards, the copper plating thicknesses which are provided on the various board innerlayers as well as the innerlayer spacings must be tightly and precisely controlled. However, inasmuch as the innerlayers are actually substructures containing plated through holes (PTH's) the surface copper thickness on the substructures may quite possibly exceed the thickness required for impedance control; in effect, the thickness comprised of the base foil plus the plated copper. This necessitates that the copper surface must be thinned down without etching the plating in the holes.

2. Discussion of the Prior Art

Although various types of multilayer and single-layer structures for printed wiring boards (PWB) and printed circuit boards (PCB) have been developed in the technology, none of these address themselves directly to solving the problem associated with the providing of tightly controlled impedances through structures and methods which will facilitate attainment of satisfactory levels of signal integrity.

Bhatt et al. U.S. Pat. No. 5,822,856 describes a process for the hole filling of a plated through hole (PTH) for a single-layer circuit board. There is no discussion of any copper thinning, varying copper thicknesses or providing for impedance control in order to eliminate problem which are encountered with regard to adverse effects on signal integrity.

Kahlert et al. U.S. Pat. No. 5,336,855 relates to a multi-layer printed circuit board which is employed for high-frequency operation and wherein the characteristic impedance is controlled through the creation of isolated metal islands which are connected to ground. The metallization layers in the structure of this patent are of equal thickness and there is no disclosure of varying copper thicknesses on different board layers and wherein there is no conductive hole fill material provided in the structure analogous to the present invention.

Swift et al. U.S. Pat. No. 5,281,771 pertains to a multi-layer wiring board with interlevel connectors, and to a method for producing the structure which provides for carbon fibers in order to form electrical interconnects between the layers. There is no discussion nor suggestion of utilizing the thinning of copper deposits on innerlayers of printed wiring board in order to provide for impedance control allowing for improved levels of signal integrity.

Strobel U.S. Pat. Nos. 4,661,654 and 4,610,756 each disclose printed circuit boards and manufacturing processes which do not direct themselves to reduction of plated copper layers or using a plated hole fill other than a hole filled with solder for pin insertion. Consequently, there is no suggestion nor disclosure of providing an impedance control so to resultingly improve signal integrity in a manner analogous with that disclosed by the present invention.

Tanaka et al, U.S. Pat. No. 3,673,680 discloses a method of fabricating printed wiring boards wherein a relatively heavy solder layer is provided at locations at which electrical and mechanical connections are required. There is no discussion nor disclosure of any multilayer substrate or of reducing the thickness of plated copper layers and of using a conductive paste-like hole fill other than having a hole filled with a solder to facilitate pin insertion.

As described in the publication "Innovations in Base Materials and Polymer Applications", European Institute of Printed Circuits, 1994, this article merely discloses the impact on process yields of using a positive working ED resist so as to provide improved conductive contrast, resolution and conductive geometry in the construction of printed circuit boards.

Finally, the article "High Density MLB's With New Materials and Build-up Technologies", Printed Circuit World Convention VII Proceedings of May 1996 describe the utilization of new materials and the forming of multi-layer laminates so as to provide improved innerlayer structures and buried via holes or blind via holes to resultingly improve higher density as well as higher accuracy in the electronic equipment and to also provide an environmentally-friendly enhanced printed circuit boards.

SUMMARY OF THE INVENTION

Accordingly, in order to impart an improvement to the currently available technology with regard to the provision of a method and resulting structure for creating an impedance-controlled printed wiring board, particularly such as a multilayered printed wiring board, the present invention is directed to the aspect of creating substructures which are laminated in order to produce an overall printed wiring board, structure wherein there is provided a control over the impedance on the innerlayers when aspects such as deep lined or deep varied vias are required or innerlayer or external surfaces are required to be of different thicknesses.

In order to attain that effect, i.e. impedance control, the invention involves the formation of a printed wiring board (PWB) substructure containing holes which are then conducively filled in with the copper surface being thinned to the appropriate thickness required for the innerlayer control. The inner layers may consist of actual substructures containing conductive paste-filled vias and wherein the thickness and the substructures of the wiring board may exceed that required for impedance control, such as the base foil thickness plus that of the plated copper; when the copper surface is thinned down.

Furthermore, pursuant to the invention, advantage is taken of the uses of currently employed technology in order to produce a high speed edge coupled and broadside differently controlled multi-layer printed wiring board arrangement allowing for multiple layer to layer (broadside) and common layer (edge coupled) differential wiring pairs to exist independently in one high speed application, for example >1 GHz.

For instance, the application of the inventively produced structure of the printed wiring board with an IBM BT resin allows for a low loss, high speed printed wiring board utilization with excellent wiring density and signal integrity capabilities. The concept pertaining to the use of deep blind interconnect layering facilitates solutions to technical manufacturing problem in plating aspect ratio difficulties by allowing for the plating and controlled copper finishing on independently fabricated subcomposite structures, which are then combined through lamination into one contiguous printed wiring board structure with highly reproducible or controllable dielectric thickness and copper feature attributes. This processing control is vital in order to achieve the proper signal integrity which is required in order to meet high speed printed wiring board applications which are currently being developed and contemplated for future applications in the technology and industry.

Pursuant to the invention, by utilizing varying dielectric thicknesses or substrates in combination with controlled copper deposition and surface treatment to achieve the proper combination of thickness, spacing, copper line width thickness and all inner and outer layers, and conductive paste-filled blind and through vias., there is developed a structure which will simultaneously apply various types of impedance controlled innerlayers on a printed wiring board. The resulting structure thus utilizes a unique combination of existing and modified manufacturing processes in order to achieve the proper attributes, wherein lamination hole fill comprising conductive pastes, deep blind vias, conductive paste-filled drilled-through holes and subcomposite structures and controlled fluid head copper etch, such as through chemical polishing, may comprise key elements allowing for the economical manufacture of the printed wiring board.

Accordingly, it is a primary object of the present invention to provide a novel method for producing a printed wiring board structure which incorporates an improved impedance control.

Another object of the present invention resides in the provision of a method for producing a multilayered printed wiring board utilizing copper thinning between innerlayers and conductive paste-filled holes or vias, including blind and through-extending holes or vias which are adapted to provide for variably controlled impedances adapted to affect signal integrity in order to regulate the latter within specified parameters.

Still another object resides in the provision of a structure for a printed wiring board which utilizes novel copper thinning technology for controlling impedance and resultingly signal integrity.

Yet another object of the present invention is to provide a multilayer printed wiring board including copper thinning and variable layer and copper plating thicknesses, and with conductive paste-filled holes of selective types which are adapted to control impedance and resultingly signal integrity.

BRIEF DESCRIPTION OF THE DRAWINGS

Reference may now be made to the following detailed description of preferred embodiments of the invention, taken into conjunction with the accompanying drawings; in which.

DETAILED DESCRIPTION OF PREFERRED EMBODIMENT

Figure 1:
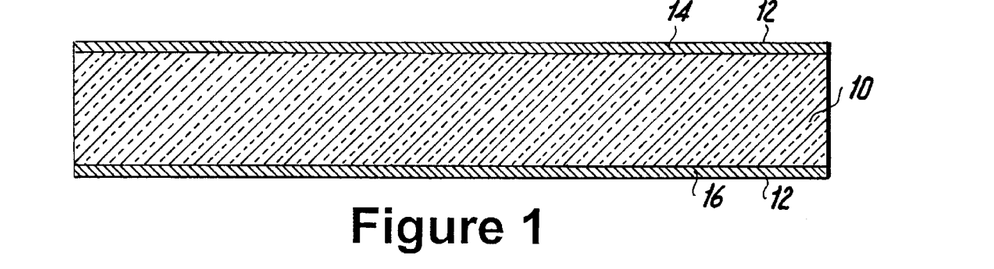
FIG. 1 generally diagrammatically illustrates a substrate layer for a printed wiring board with applied copper foil.

Referring in more specific detail to the drawings, particularly, FIG. 1 illustrates a section of a dielectric substrate 10 for a printed wiring board having a thickness of copper foil material 12 applied on both sides or surfaces 14, 16 thereof, in an initial step of producing the impedance controlled printed wiring board structure. Although two conductive layers and one dielectric layer are shown for base member 10, it is understood that the invention is not limited thereto. Specifically, it is only necessary to provide one such conductive layer and one such dielectric layer while still attaining the advantageous results taught herein. At least two layers of each are used when it is desired to incorporate an internal conductive plane (e.g., power, ground or signal) as part of the final structure. Understandably, several conductive dielectric layers and corresponding internal conductive planes may be utilized, depending on operational requirements for the finished product. Subsequently, a base member represented here could be fabricated from conductive layers that do not require personalization.

Figure 2:
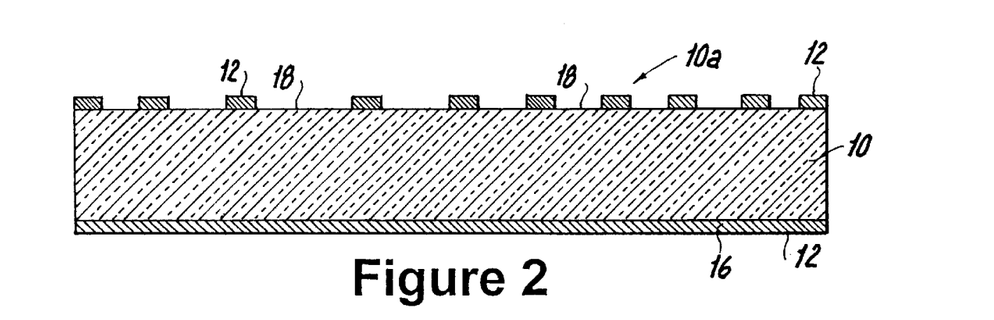
FIG. 2 illustrates the substrate layer and copper foil of FIG. 1 shown personalized by being etched on one side thereof.

As shown in FIG. 2, one side 10a of the dielectric substrate 10 is personalized by etching portions 18 of the copper foil 12 so as to provide a wiring pattern (not shown) as may be required by specific intended physical applications for the printed wiring board.

Figure 3:
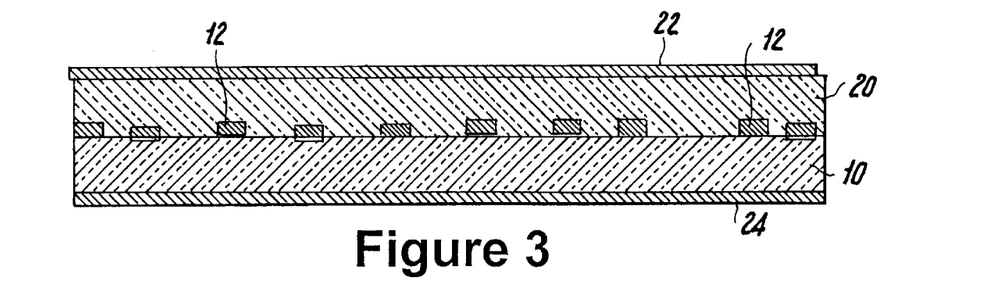
FIG. 3 illustrates a second layer of the substrate superimposed on and laminated to the previous layer with the personalized located layers now being internal, and both outer surfaces being thinned by etching.
Figure 4:
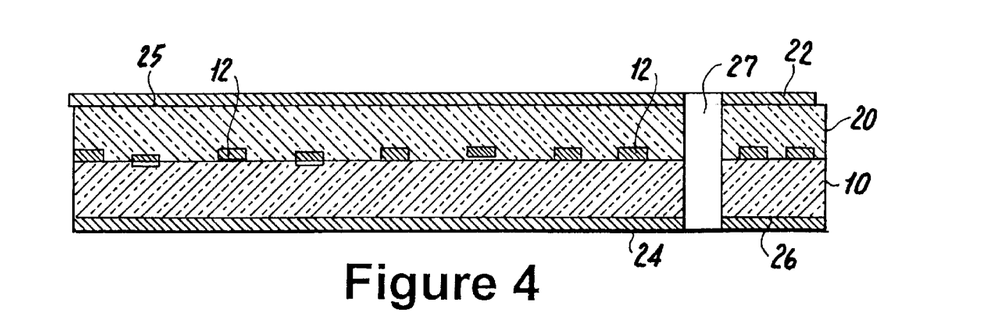
FIG. 4 illustrates the laminated structure of FIG. 3 being provided with at least one drilled hole.

Pursuant to FIG. 3, representative of a subsequent step of the inventive method, a second layer 20 of a substrate consisting of a dielectric material is laminated to the first substrate layer 10, such that the personalized layer of the etched copper foil 12 is now positioned internally by between the two dielectric substrate layers 10, 20. Both sides 22, 24 or external surfaces of the laminated substrate layers 10, 20 have the copper surfaces 25, 26 then etched so as to be thinned; for example, to about 5 to 7 microns, as may be required. Thereafter, as shown in FIG. 4, drilled holes 27, of which one is illustrated are then formed so as to extend through the laminated substrates 10, 20 and the copper layers or foils 25, 26 located on both of the external surfaces. Although only one opening is shown formed in the substrate, it is understood that multiple openings may be formed depending on the ultimate electrical requirements of the circuitized substrate.

Figure 5:
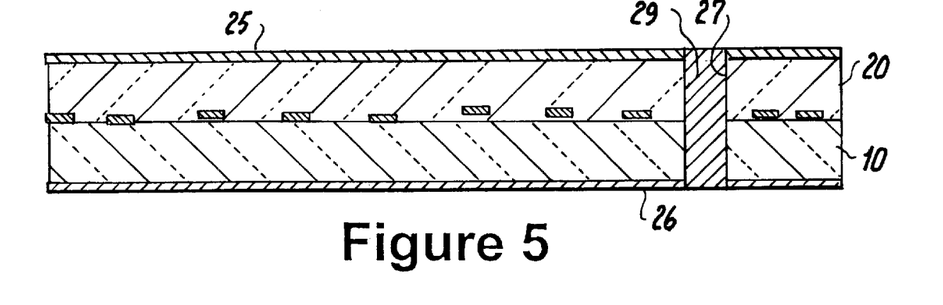
FIG. 5 illustrates the at least one drilled hole of FIG. 4 being filled with a conductive paste composition.

As illustrated in FIG. 5, the drilled holes 27, of which only one is shown for purposes of clarity, are then filled with an (electrically) conductive paste composition 29, communicating with the surface copper layers 25, 26, as required.

Figure 6:
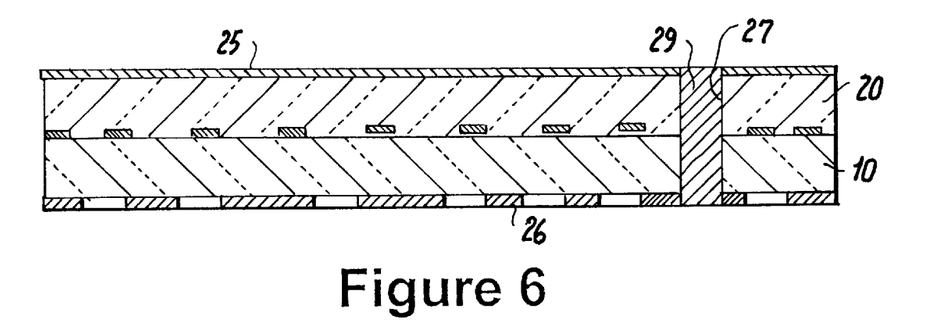
FIG. 6 illustrates the laminated structure of FIG. 5, shown personalized on one side.

Referring to FIG. 6 of the drawings, the laminated substrates 10 and 20 have one of the surfaces personalized, in this instance, by way of example, the surface 26 which will essentially form the interior surface of a further composite structure, as described hereinbelow.

Figure 7:
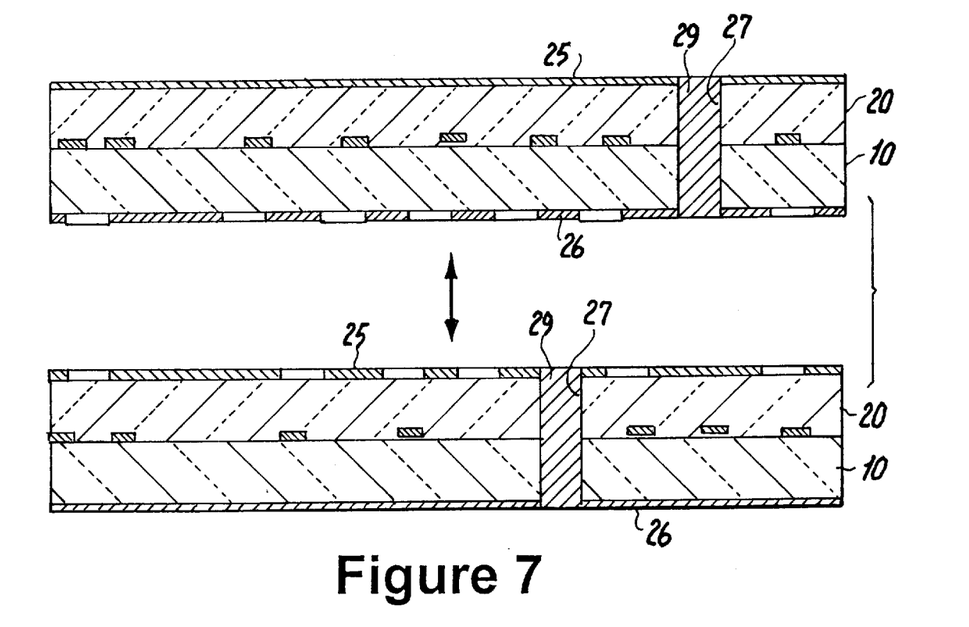
FIG. 7 illustrates the laminating step of combining two of the structures of FIG. 6.

As illustrated in FIG. 7 of the drawings, two of the laminated substructures are adapted to be laminated into a further larger composite, each substructure being identified by the reference numerals 20, 20 and the layers or surface areas 25, 26 of copper, with each of the drilled holes 27 being filled with the conductive paste composition 29 and wherein the facing personalized copper layers 25, 26 on the surfaces of the laminate substructures face each other.

Figure 8:
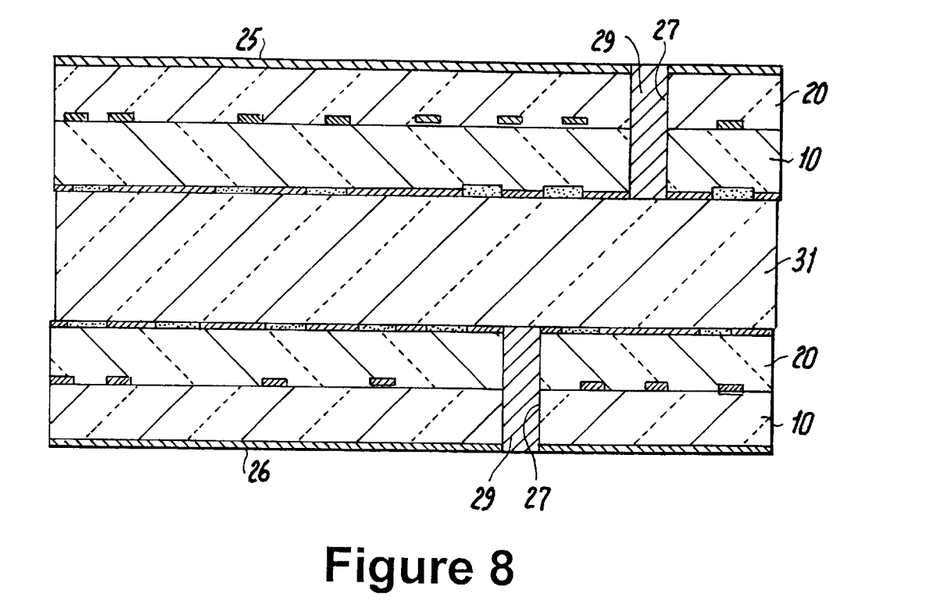
FIG. 8 illustrates a composite formed with the combined structures of FIG. 7.
Figure 9:
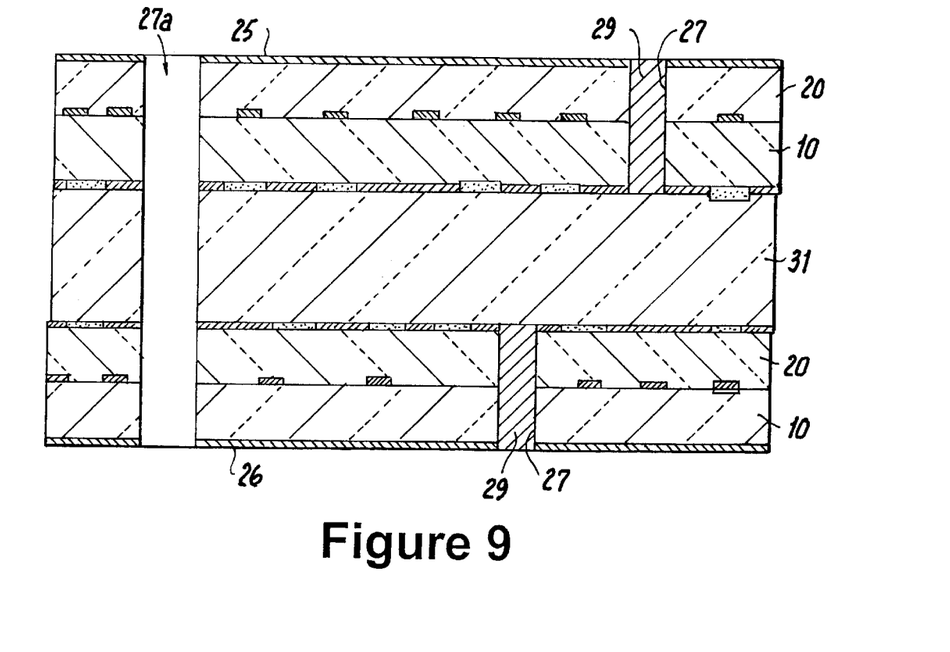
FIG. 9 illustrates the composite of FIG. 8 provided with through-extending drill holes.
Figure 10:
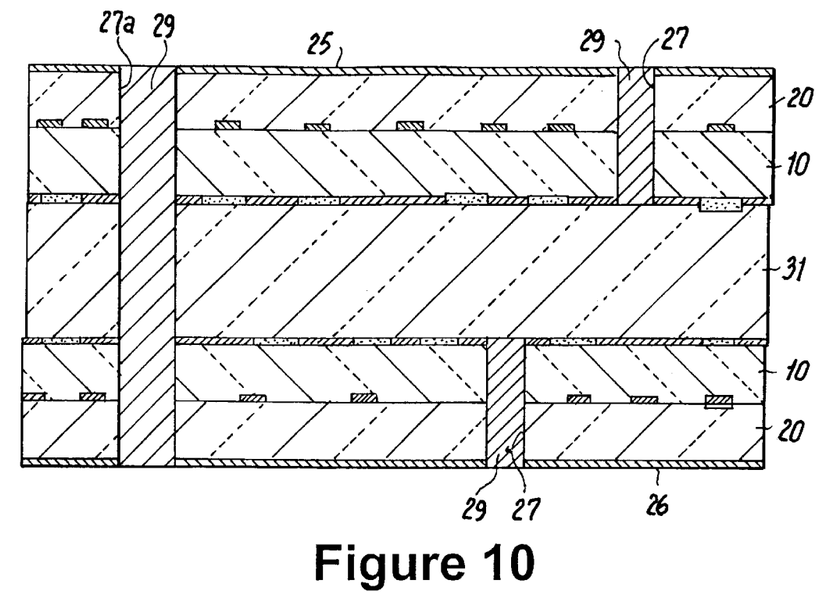
FIG. 10 illustrates the composite of FIG. 9 wherein the through-extending drill holes and blind vias are filled with a conductive paste.

As illustrated in FIG. 8 of the drawings, a further dielectric layer 31 has been interposed between the substructures as described hereinabove. Thereupon at suitable locations one or more through-holes 27a as shown in FIG. 9, are formed to extend through the entire composite structure between the outer layers. The drilled holes 27a, as shown in FIG. 10, are then filled with (electrically) conductive paste composition 29 as set forth hereinabove.

Figure 11:
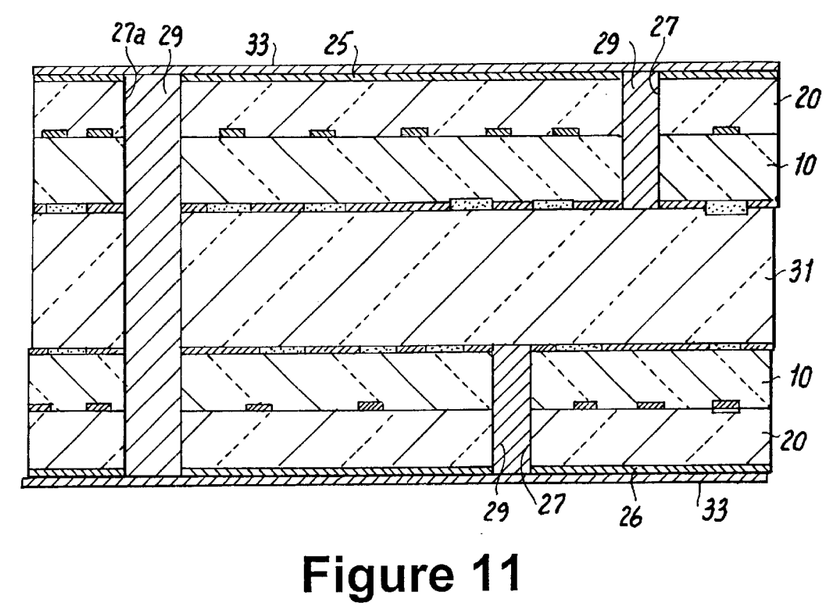
FIG. 11 illustrates the composite of FIG. 10 wherein the fill holes are overplated.
Figure 12:
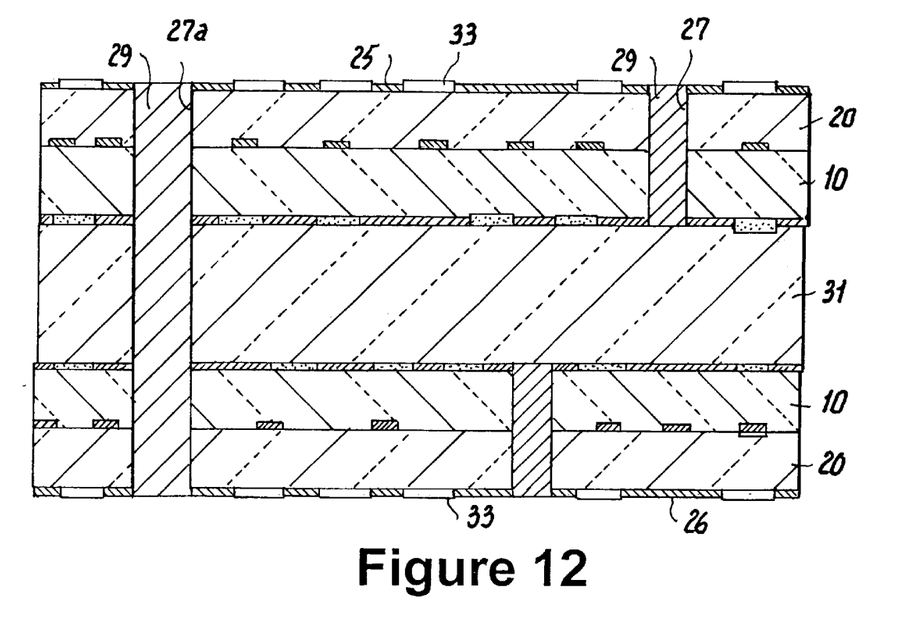
FIG. 12 illustrates the composite of FIG. 11 having the external surfaces selectively circuitized on one or both sides thereof.

As shown in FIG. 11, the conductive paste-filled holes 27, 27a are then overplated at the exterior surfaces of the composite structure with a further copper layer 33 which, as shown in FIG. 12 of the drawings, may be externally circuitized on either one or both sides thereof depending upon whether this is a final structure or whether another substructure is to be superimposed thereon.

Figure 13:
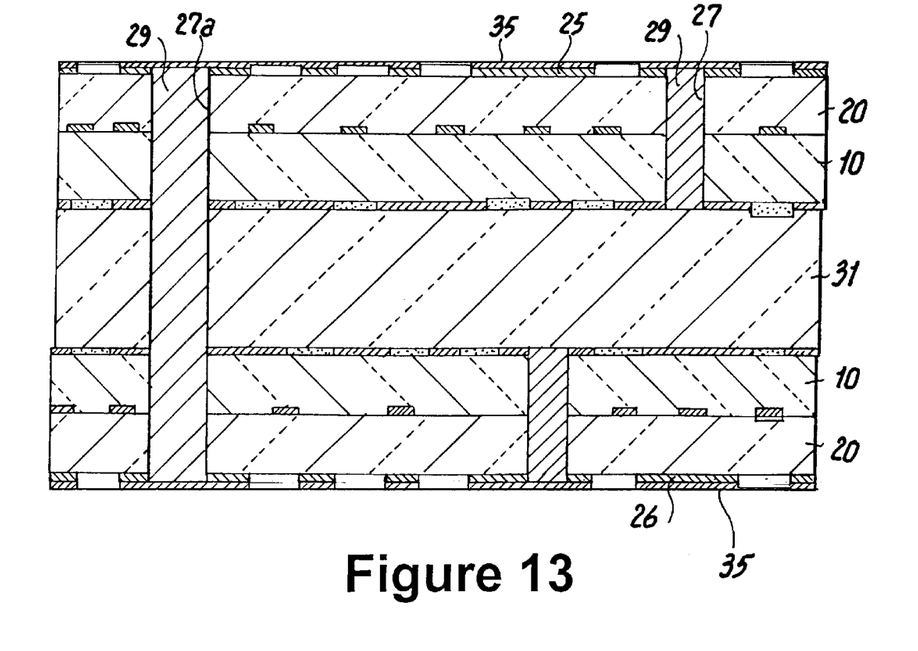
FIG. 13 illustrates the overplated fill holes with the composite having the external surfaces selectively circuitized on one or both sides thereof.
Figure 14:
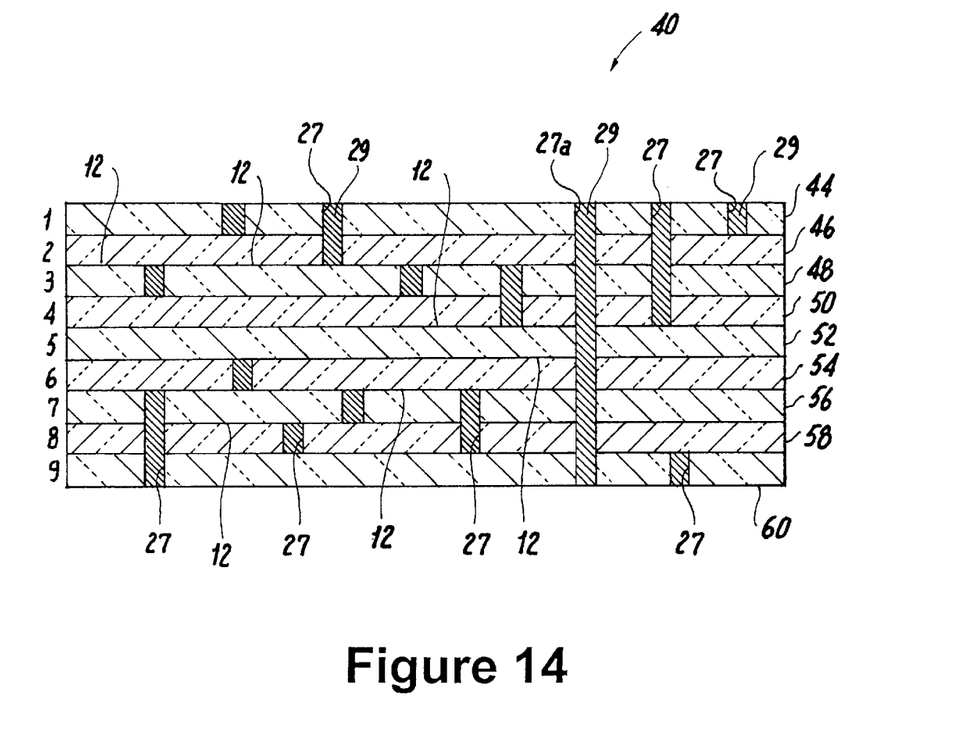
FIG. 14 illustrates a multilayer printed wiring board (PWB) combination showing the laminated structure produced in accordance with the inventive method.

As illustrated, by way of example in FIG. 13 of the drawings, a further copper layer 35 may be applied over the previous surface of the circuitized substrate and the exterior surface circuitized on whether this is a final structure or another substructure to be placed thereon. As illustrated in FIG. 14 there is disclosed a final multilayer printed wiring board.

The final multilayer printed wiring board 40 (PWB) is represented in FIG. 14 of the drawings illustrating a combination of building blocks similar to that of FIG. 12 or 13, in this instance showing nine layers of various customized building blocks, although any number as necessary can be utilized, which when laminated form the multilayer printed circuit board arrangement 40. As illustrated in the drawing, the vertical rectangles represent "deep blind" or "deep buried" vias 27 which are provided with a conductive paste fill 29. Moreover, the structure may be provided with one or more of the conductive paste-filled through holes 27a extending through the entire thickness or depth of the laminated dielectric layers 44, 46, 48, 50, 52, 54, 56, 58 and 60, which vias can be selectively either filled with conductive paste 29 or remain unfilled, there can be provided a building block without the presence of any vias. It is to be understood that the structure in FIG. 14 is not solely constructed of elements described in FIG. 8. Structures as shown in FIG. 2 can be incorporated into the structure especially where the vias need to end within the main structure. It is further understood that the structures shown in FIG. 3 can be single sided personalized as that of FIG. 2 and built up as many times as needed prior to the processing steps of the drilled via formation and subsequent holefilling with conductive paste 29.

With regard to the various vias or through holes being filled with a conductive paste material 29, it is also possible that these may be in various instances plated-through holes (PTH's) as described and claimed in parent patent application Ser. No. 09/495,628, of which the present application is a continuation-in-part application.

In essence, the important aspect of the invention resides in that the various through holes 27 or deep blind or buried vias are each filled with a conductive paste 29 which eliminates the limitations of the maximum aspect ratio of a total composite structure caused by the requirement of providing plating for the holes or vias. This particular structure is an extremely simple arrangement which enables the drilling of lengthy holes and the filling thereof with the conductive paste 29 in a novel and economically simple manner, presently difficult to accomplish with equipment for forming plated through-holes in thick composite structures.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method for producing an electronic package possessing multiple differential impedance controlled layers, said method comprising the steps of:

providing a first substrate comprising a dielectric material; applying a first conductive layer on at least one surface of said first substrate, said first conductive layer having a first thickness;

plating a second conductive layer on an opposite surface of said first substrate, said second conductive layer having a second thickness; thinning at least one of said first and second conductive layers to control the impedance of the thinned conductive layer relative to the impedance of an other conductive layer;

laminating a second dielectric substrate to said first substrate forming a laminated substrates so as cause at least one of said first and second conductive layers to comprise an innerlayer intermediate said laminated substrate; forming holes in said laminate substrate, and filling at least some of said holes with a conductive paste material to provide electrical communication with said first and second conductive layers.

2. A method for producing an electronic package as claimed in claim 1, wherein said laminated substrate includes external surfaces each provided with said conductive layers, and etching said external conductive layers to predetermined thicknesses.

3. A method for producing an electronic package as claimed in claim 1, wherein said holes comprise deep blind holes and buried holes and through-extending holes forming vias in said laminated substrate.

4. A method for producing an electronic package as claimed in claim 1, wherein at least one external surface of said first and second conductive layers on each said first and second substrate is etched to form a personalized printed wiring pattern.

5. A method for producing an electronic package as claimed in claim 1, wherein a plurality of said laminated substrate are combined to form a composite for a multilayer electronic package.

6. A method for producing an electronic package as claimed in claim 5, wherein at least one through-extending hole is formed in said composite between the opposite surfaces of said laminated substrate, said conductive paste material being filled into said at least one through-hole so as to provide electrical communication between said first and second conductive layers.

7. A method for producing an electronic package as claimed in claim 6, wherein said at least one through-extending hole is a drilled hole.

8. A method for producing an electronic package as claimed in claim 1, wherein said electronic package comprises a printed wiring board.

9. A method for producing an electronic package as claimed in claim 1, wherein said at least one of said first and second conductive layers is thinned by etching to a predetermined thickness to control the impedance of the etched conductive layer relative to the impedance of an other conductive layer.

10. A method for producing an electronic package as claimed in claim 9, wherein said at least one of said first and second conductive layers is copper and is thinned by etching said at least one of said first and second conductive copper layers to a predetermined thickness to control the impedance of the etched conductive copper layer relative to the impedance of the other conductive layer.

11. An electronic package possessing multiple differential impedance controlled layers, comprising:
a first substrate comprising a dielectric material; a first conductive layer applied on at least one surface of said first substrate, said first conductive layer having a first thickness;
a second conductive layer plated on an opposite surface of said first substrate, said second conductive layer having a second thickness; at least one of said first and second conductive layers is thinned relative to an other conductive layer to control the impedance of the thinned conductive layer relative to the impedance of the other conductive layer; a second dielectric substrate laminated to said first substrate forming a laminated substrate so as to cause at least one of said first and second conductive layers to comprise an innerlayer intermediate said laminated substrate; holes formed in said laminate substrate, and at least some of said holes being filled with a conductive paste material to provide electrical communication with said first and second conductive layers.

12. An electronic package as claimed in claim 11, said laminated substrate include external surfaces each provided with said conductive layers, and said external conductive layers are etched to predetermined thicknesses.

13. An electronic package as claimed in claim 11, wherein said holes comprise deep blind holes and buried holes and through-extending holes forming vias in said laminated substrate.

14. An electronic package as claimed in claim 11, wherein at least one external surface of said first and second conductive layers on each said first and second substrate is etched to form a personalized printed wiring pattern.

15. An electronic package as claimed in claim 11, wherein a plurality of said laminated substrate(s) are combined to form a composite multilayer electronic package.

16. An electronic package as claimed in claim 15, wherein at least one through-extending hole is formed in said composite between the opposite surfaces of said laminated substrates, said conductive paste material being filled into said at least one through-hole so as to provide electrical communication between said first and second conductive layers.

17. An electronic package as claimed in claim 16, wherein said at least one through-extending hole is a drilled hole.

18. An electronic package as claimed in claim 11, wherein said electronic package comprises a printed wiring board.

19. An electronic package as claimed in claim 11, wherein said at least one of said first and second conductive layers is thinned by etching to a predetermined thickness.

20. An electronic package as claimed in claim 11, said at least one of said first and second conductive layers is a copper conductive layer which is thinned by etching the copper conductive layer to a predetermined thickness.

\* \* \* \* \*